United States Patent
Hattori

(10) Patent No.: US 7,400,664 B1
(45) Date of Patent: Jul. 15, 2008

(54) LASER ARRAY DEVICE AND LASER ARRAY CONTROL METHOD

(75) Inventor: Yoshikazu Hattori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 262 days.

(21) Appl. No.: 10/949,317

(22) Filed: Sep. 27, 2004

Related U.S. Application Data

(63) Continuation of application No. PCT/JP02/03115, filed on Mar. 28, 2002.

(51) Int. Cl.
    *H01S 5/00* (2006.01)
(52) U.S. Cl. ...................... 372/50.12; 385/14
(58) Field of Classification Search ............. 385/88, 385/14, 49; 372/29.015, 29.02; 250/208.2; 369/112.21
See application file for complete search history.

(56) References Cited

U.S. PATENT DOCUMENTS

| | | | |
|---|---|---|---|
| 4,623,784 A | 11/1986 | Haddock et al. | |
| 5,191,204 A * | 3/1993 | Dickson et al. | 250/208.2 |
| 5,247,167 A * | 9/1993 | Bargerhuff et al. | 250/208.1 |
| 5,500,869 A | 3/1996 | Yoshida et al. | |
| 5,586,096 A | 12/1996 | Isobe et al. | |
| 5,689,491 A | 11/1997 | Isobe et al. | |
| 5,825,952 A | 10/1998 | Kawanishi et al. | |
| 6,091,689 A * | 7/2000 | Taniguchi et al. | 369/112.21 |
| 6,111,903 A * | 8/2000 | Isaksson et al. | 372/50.21 |
| 6,421,474 B2 * | 7/2002 | Jewell et al. | 385/14 |
| 6,453,081 B1 * | 9/2002 | Trezza et al. | 385/14 |

FOREIGN PATENT DOCUMENTS

| | | |
|---|---|---|
| JP | 55-45239 | 3/1980 |
| JP | 56-114563 | 9/1981 |
| JP | 58-140652 | 9/1983 |
| JP | 4-151886 | 5/1992 |
| JP | 5-144074 | 6/1993 |
| JP | 5-210846 | 8/1993 |
| JP | 5-236213 | 9/1993 |
| JP | 05-236213 * | 9/1993 |
| JP | 6-3542 | 1/1994 |
| JP | 06-334262 * | 2/1994 |
| JP | 6-106775 | 4/1994 |

(Continued)

OTHER PUBLICATIONS

U.S. Appl. No. 10/272,284, filed Oct. 17, 2002.

*Primary Examiner*—Minsun Harvey
*Assistant Examiner*—Tuan N. Nguyen
(74) *Attorney, Agent, or Firm*—Westerman, Hattori, Daniels & Adrian, LLP.

(57) ABSTRACT

In a laser array device, each laser of a transmitting unit 30 and each optical detector of a receiving unit 20 are arranged to be adjacent to each other. A plurality of unit modules 40 are formed so that each unit module 40 contains adjoining laser 30-1 and optical detector 20-1, and a laser control circuit 10-1. In each unit module, a part of laser beam outputted from the laser is reflected and outputted to the optical detector, an intensity of the laser beam outputted from the laser is detected based on a detection signal outputted from the optical detector, and when the detected laser-beam intensity exceeds a predetermined reference level, the output of the laser beam of the laser is stopped.

7 Claims, 11 Drawing Sheets

FOREIGN PATENT DOCUMENTS

| | | | |
|---|---|---|---|
| JP | 6-334262 | | 12/1994 |
| JP | 06-334262 | * | 12/1994 |
| JP | 08-045107 | * | 2/1996 |
| JP | 8-45107 | | 2/1996 |
| JP | 08-124209 | * | 5/1996 |
| JP | 8-124209 | | 5/1996 |
| WO | WO01/80384 | | 10/2001 |

* cited by examiner

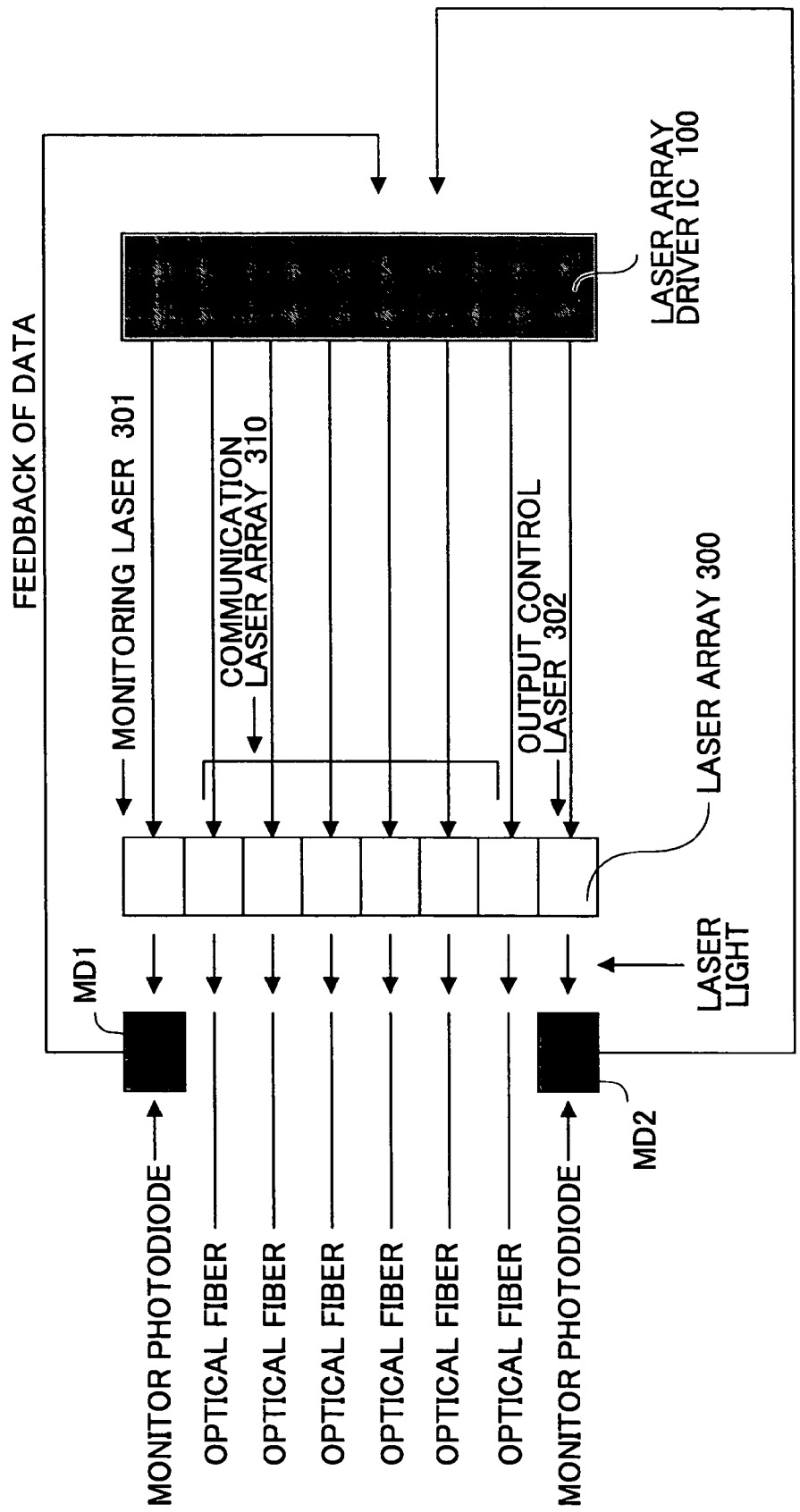

- CPU BOARD 70
- IC 76
- CPU CHIP 74
- PARALLEL OPTICAL TRANSCEIVER 72

- PARALLEL OPTICAL CABLE 78
- 72
- MOTHERBOARD 84
- CPU BOARD 70
- POWER SUPPLY 82
- MULTI-CPU DEVICE 80
- MEMORY BOARD 86

LASER ARRAY DEVICE AND LASER ARRAY CONTROL METHOD

CROSS-REFERENCE TO RELATED APPLICATIONS

This application is a U.S. continuation application which is filed under 35 USC 111(a) and claims the benefit under 35 USC 120 and 365(c) of International Application No. PCT/JP02/03115, filed on Mar. 28, 2002, the entire contents of which are hereby incorporated by reference.

BACKGROUND OF THE INVENTION

1. Field of the Invention

The present invention generally relates to a laser array device and laser array control method, and more particularly to a laser array device and laser array control method which detects independently respective optical outputs of lasers of a laser array and controls the laser array driving.

2. Description of the Related Art

In recent years, with the progress of optical-communication technology, the information processing devices are connected together by the optical fiber cables, and the communication between the information processing devices has come to be performed by transmitting and receiving the optical signals via the optical fiber cables.

The laser array device is used to output the laser beam from the laser light source to the optical fiber cable according to transmission information. The laser array device is usually equipped with a laser safety circuit. This laser safety circuit is provided to control the output of the laser array so that the intensity of the laser beam outputted from the laser array device satisfies the requirements of the laser safety standards.

FIG. 1 shows the composition of a conventional laser array device. As shown in FIG. 1, the conventional laser array device comprises the laser array driver IC 100, the laser array 300, the monitor photodiode MD1, and the monitor photodiode MD2.

The laser array driver IC 100 and the monitor photodiode MD1 constitute the first detection and control loop of the laser safety circuit, and the laser array driver IC 100 and the monitor photodiode MD2 constitute the second detection and control loop of the laser safety circuit.

The laser array 300 comprises the communication laser array 310, the monitoring laser 301, and the output control laser 302.

The monitor photodiode MD1 detects the laser beam outputted from the monitoring laser 301, and feeds back the detected information to the laser array driver IC 100.

The monitor photodiode MD2 detects the laser beam outputted from the output control laser 302, and feeds back the detected information to the laser array driver IC 100.

In the example of FIG. 1, the communication laser array 310 is provided to output the laser beams of six channels (or six bits) for the sake of convenience of description. In the conventional laser array device, the communication laser array 310 is controlled by carrying out the monitoring of the laser beams outputted from the monitoring laser 301 and the output control laser 302 by means of the first and second detection and control loops.

The laser array driver IC 100 controls the intensity of each of the six-channel laser beams outputted from the communication laser array 310. That is, the input data of the six channels according to transmission information which should be transmitted is inputted into the laser array driver IC 100, and the laser array driver IC 100 drives each of the lasers of the communication laser array 310 according to the input data of the six channels. The laser beams outputted from the lasers of the communication laser array 310 are outputted to the six optical fiber cables, respectively.

In the case of the conventional laser array device, when the performance of the monitoring laser 301 degrades or the laser output efficiency thereof falls, the control information to increase the intensity of each of the laser beams outputted from the communication laser array 310 is sent from the monitor photodiode MD1 to the laser array driver IC. In such a case, the laser output of the communication laser array 310, which operates normally, may exceed the reference level of the laser-beam intensity of the laser safety standards.

In order to prevent this problem, the second detection and control loop, which comprises the monitor photodiode MD2 and the output control laser 302, is provided, and, when the intensity of the output laser beam of the output control laser 302 which is detected by the monitor photodiode MD2 exceeds the reference level, the laser array driver IC 100 detects the excessive laser-beam intensity, and performs the control of stopping the laser output of the communication laser array 310.

However, when both the monitoring laser 301 and the output control laser 302 break down, the control function to stop the laser output exceeding the reference level does not work in the conventional laser array device. That is, in this case, the excessive laser beam may be outputted from the communication laser array 310.

As described above, the conventional laser array device is configured so that the monitoring laser 301 and the output control laser 302 separate from the communication laser array 310 are arranged, and the monitor photodiodes MD1 and MD2 corresponding to these exclusive-use lasers are arranged. For this reason, if any of the exclusive-use lasers 301 and 302 and the photodiodes MD1 and MD2 break down, sufficient countermeasures against that case are not taken.

Moreover, when any of the exclusive-use lasers 301 and 302 and the photodiodes MD1 and MD2 break down, the oscillation of all the lasers of the communication laser array 310 may be stopped by the control information so that the whole system carrying the laser array device stops, even if the lasers of the communication laser array 310 are not out of order.

SUMMARY OF THE INVENTION

An object of the present invention is to provide an improved laser array device in which the above-described problems are eliminated.

Another object of the present invention is to provide a laser array device and laser array control method which provides increased safety for the laser output by detecting and controlling respective optical outputs of the lasers of the laser array independently of each other.

Another object of the present invention is to provide an information processing device equipped with the laser array device which provides increased safety for the laser output by detecting and controlling the respective optical outputs of the lasers of the laser array independently of each other.

The above-mentioned objects of the present invention are achieved by a laser array device comprising: a transmitting unit having a plurality of lasers outputting laser beams carrying transmission data which are sent to an external device; a receiving unit having a plurality of optical detectors detecting laser beams carrying data which are received from an external device; and a control unit having a plurality of laser control circuits which respectively drive the lasers of the transmitting unit in accordance with the transmission data, wherein the plurality of lasers and the plurality of optical detectors are formed adjacent to each other into a plurality of unit modules, each of the plurality of unit modules containing one of the lasers of the transmitting unit, one of the optical detectors of the receiving unit, which adjoin to each other, and one of the laser control circuits of the control unit, and wherein each unit module is configured to reflect a part of laser beam outputted from the laser concerned to input the part of the laser beam into the optical detector concerned, to detect an intensity of the laser beam outputted from the laser concerned based on a detection signal outputted from the optical detector concerned, and to stop the laser output of the laser concerned when the detected laser-beam intensity exceeds a predetermined reference level.

The above-mentioned objects of the invention are achieved by an information processing device in which a laser array device is incorporated, the information processing device transmitting an optical signal to and receiving an optical signal from an external information processing device through an optical fiber cable, the laser array device comprising: a transmitting unit having a plurality of lasers outputting laser beams carrying transmission data which are sent to an external device; a receiving unit having a plurality of optical detectors detecting laser beams carrying data which are received from an external device; and a control unit having a plurality of laser control circuits which respectively drive the lasers of the transmitting unit in accordance with the transmission data, wherein the plurality of lasers and the plurality of optical detectors are formed adjacent to each other into a plurality of unit modules, each of the plurality of unit modules containing one of the lasers of the transmitting unit, one of the optical detectors of the receiving unit, which adjoin to each other, and one of the laser control circuits of the control unit, and wherein each unit module is configured to reflect a part of laser beam outputted from the laser concerned to input the part of the laser beam into the optical detector concerned, to detect an intensity of the laser beam outputted from the laser concerned based on a detection signal outputted from the optical detector concerned, and to stop the laser output of the laser concerned when the detected laser-beam intensity exceeds a predetermined reference level.

The above-mentioned objects of the invention are achieved by a of controlling a laser array device which comprises a transmitting unit having a plurality of lasers outputting laser beams carrying transmission data which are sent to an external device, a receiving unit having a plurality of optical detectors detecting laser beams carrying data which are received from an external device, and a control unit having a plurality of laser control circuits which respectively drive the lasers of the transmitting unit in accordance with the transmission data, wherein the plurality of lasers and the plurality of optical detectors are formed adjacent to each other into a plurality of unit modules, each of the plurality of unit modules containing one of the lasers of the transmitting unit, one of the optical detectors of the receiving unit, which adjoin to each other, and one of the laser control circuits of the control unit, the method comprising the steps of: reflecting a part of laser beam outputted from the laser concerned of each unit module when the laser output of the laser concerned is in progress, so that the part of the laser beam is inputted into the optical detector concerned; detecting an intensity of the laser beam outputted from the laser concerned based on a detection signal outputted from the optical detector concerned; and stopping the laser output of the laser concerned when the detected laser-beam intensity exceeds a predetermined reference level.

According to the laser array device and the laser array control method of the present invention, a part of the optical output from each of the respective laser light sources of the communication laser array is detected independently and the feedback control of the detected information is carried out. Even if a failure occurs in each laser light source, the optical output of the whole laser array device does not stop. The problem that a failure of the monitoring laser leads to the system-wide failure as in the conventional laser array device is eliminated according to the present invention.

For example, when one of the laser light sources in the communication unit breaks down, the breakdown only affects only one bit of the transmission data according to the present invention. By using the parity check function etc., the occurrence of system-wide failure can be avoided.

Moreover, according to the laser array device and the information processing device of the present invention, the optical detector of the receiving unit is utilized as the detection and control loop of the laser safety circuit. When compared with the conventional laser array device wherein the additional monitoring detectors must be arranged separately according to the corresponding number of the lasers of the transmitting laser array of the transmitting unit, it is not necessary for the present invention to provide an additional monitoring photodetector, and reduction of the manufacturing cost can be attained.

Other objects, features and advantages of the present invention will be apparent from the following detailed description when read in conjunction with the accompanying drawings.

BRIEF DESCRIPTION OF THE DRAWINGS

FIG. 1 is a diagram showing the composition of the conventional laser array device.

DETAILED DESCRIPTION OF PREFERRED EMBODIMENTS

A description will now be given of preferred embodiments of the present invention with reference to the accompanying drawings.

Figure 2A:
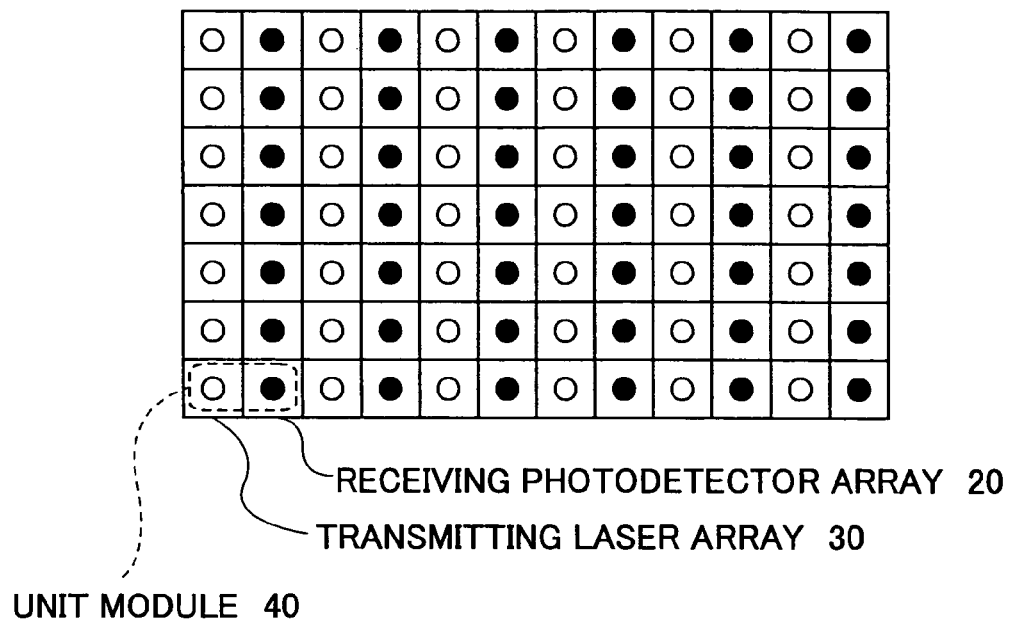
FIG. 2A and FIG. 2B are diagrams showing the fundamental composition of the laser array device of the present invention.
Figure 2B:
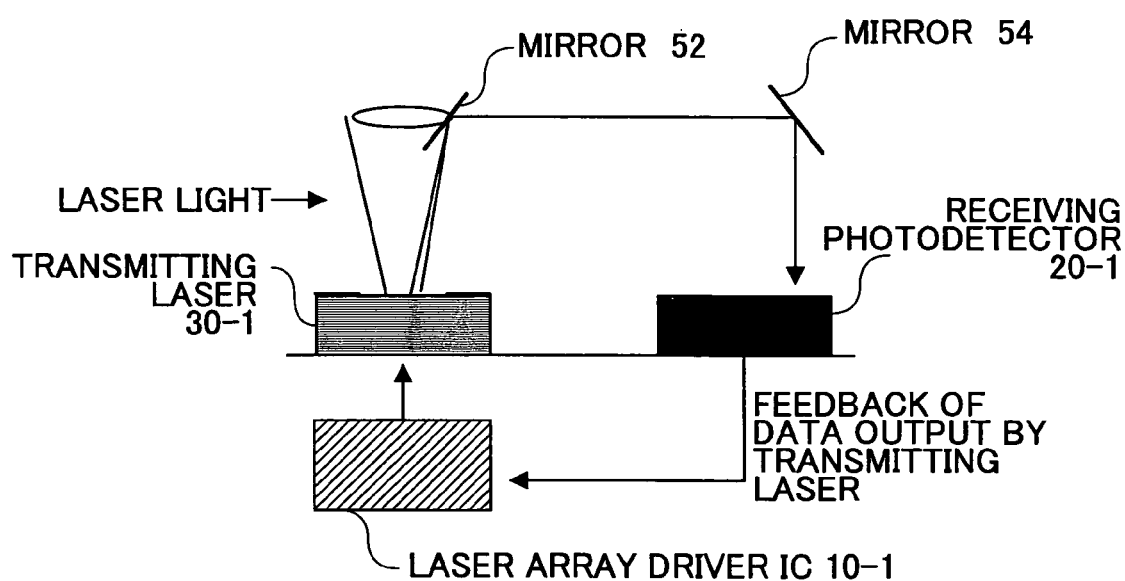

FIG. 2A and FIG. 2B show the fundamental composition of the laser array device of the present invention.

As shown in FIG. 2A, in the laser array device of this embodiment, the pairs of the receiving photodetector array 20 and the transmitting laser array 30 are arranged in parallel so that the photodetector array 20 and the laser array 30 are adjacent to each other. The number of the pairs of the photodetector array 20 and the laser array 30 in the laser array device may be one or plural.

In the receiving photodetector array 20, the plurality of photodetectors (optical detectors) are arranged in a row, and each photodetector is formed to detect the laser beam carrying data transmitted from an external device, and to have the optical detection function which outputs the detected optical signal.

The receiving photodetector array 20 having the plurality of photodetectors operates as a receiving unit which inputs the optical signal sent from the information processing device of the sending node via the optical fiber cable.

In the transmitting laser array 30, the plurality of lasers are arranged in a row, and each laser is formed to function as a laser light source which outputs the laser beam carrying transmission data being sent to an external device.

The transmitting laser array 30 having the plurality of laser light sources operates as a transmitting unit which outputs the optical signal which is transmitted to the information processing device of the second node via the optical fiber cable.

In the following, unit block containing the pair of one laser of the transmitting laser array 30 and one photodetector of the receiving photodetector array 20, which are adjacent to each other, will be called unit module 40. Moreover, the laser array device according to the present invention comprises the plurality of unit modules 40, and there is no need to contain an additional monitoring laser or additional monitoring photodetector in order to provide increased safety for the laser output.

As shown in FIG. 2B, the laser array driver IC 10-1 (laser control circuit) is provided in the laser array device of the present invention. It is possible that this laser array driver IC is provided corresponding to each of the plurality of unit modules 40. Alternatively, it is possible that a single IC forming the plurality of laser control circuits corresponding to the plurality of unit modules 40 is provided in the laser array device of the present invention.

The input data according to transmission information which should be transmitted are inputted into the laser array driver IC 10-1, and the laser array driver IC drives the transmitting laser 30-1 according to a corresponding bit of the input data.

The laser array driver IC 10-1 is connected to the receiving photodetector 20-1 by the signal line, and the laser array driver IC 10-1 receives the laser output information of the transmitting laser 30-1 fed back from the photodetector 20-1.

The laser array driver IC 10-1 controls the intensity of the laser beam outputted from the transmitting laser 30-1 according to the received laser output information of the transmitting laser 30-1.

The plurality of unit modules 40 of FIG. 2A are provided in the laser array device of the present invention. Each unit module 40 not only constitutes the transmitter/receiver unit of the optical signal, but also constitutes the laser safety circuit for one laser of the transmitting laser array 30.

As shown in FIG. 2B, each unit module 40 comprises the transmitting laser 30-1 (one laser of the transmitting laser array 30), the receiving photodetector 20-1 (one photodetector of the receiving photodetector array 20), the first mirror 52, and the second mirror 54.

The first mirror 52 and the second mirror 54 reflect a part of laser beam outputted from the transmitting laser 30-1, and input the reflected light into the receiving photodetector 20-1.

The receiving photodetector 20-1 detects the received laser beam, and feeds back the detected information to the laser array driver IC 10-1.

The laser array driver IC 10-1 controls the intensity of the laser beam outputted from the transmitting laser 30-1 based on the detected information received from the photodetector 20-1.

For example, when the detected information received from the photodetector 20-1 indicates a fall of the intensity of the output laser beam of the transmitting laser 30-1, the laser array driver IC 10-1 performs the control which increases the drive current supplied to the transmitting laser 30-1 from the laser array driver IC 10-1 in order to raise the intensity of the laser beam outputted from the transmitting laser 30-1.

On the contrary, when the detected information received from the photodetector 20-1 indicates a rise of the intensity of the output laser beam of the transmitting laser 30-1, the laser array driver IC 10-1 performs the control which decreases the drive current supplied to the transmitting laser 30-1 from the laser array driver IC 10-1 in order to lower the intensity of the laser beam outputted from the transmitting laser 30-1.

Moreover, when it is detected from the received detected information that the intensity of the output laser beam of the transmitting laser 30-1 exceeds the reference level of the laser safety standards, the laser array driver IC 10-1 stops the supply of the drive current to the transmitting laser 30-1 so that the laser output of the transmitting laser 30-1 is stopped.

Figure 3:
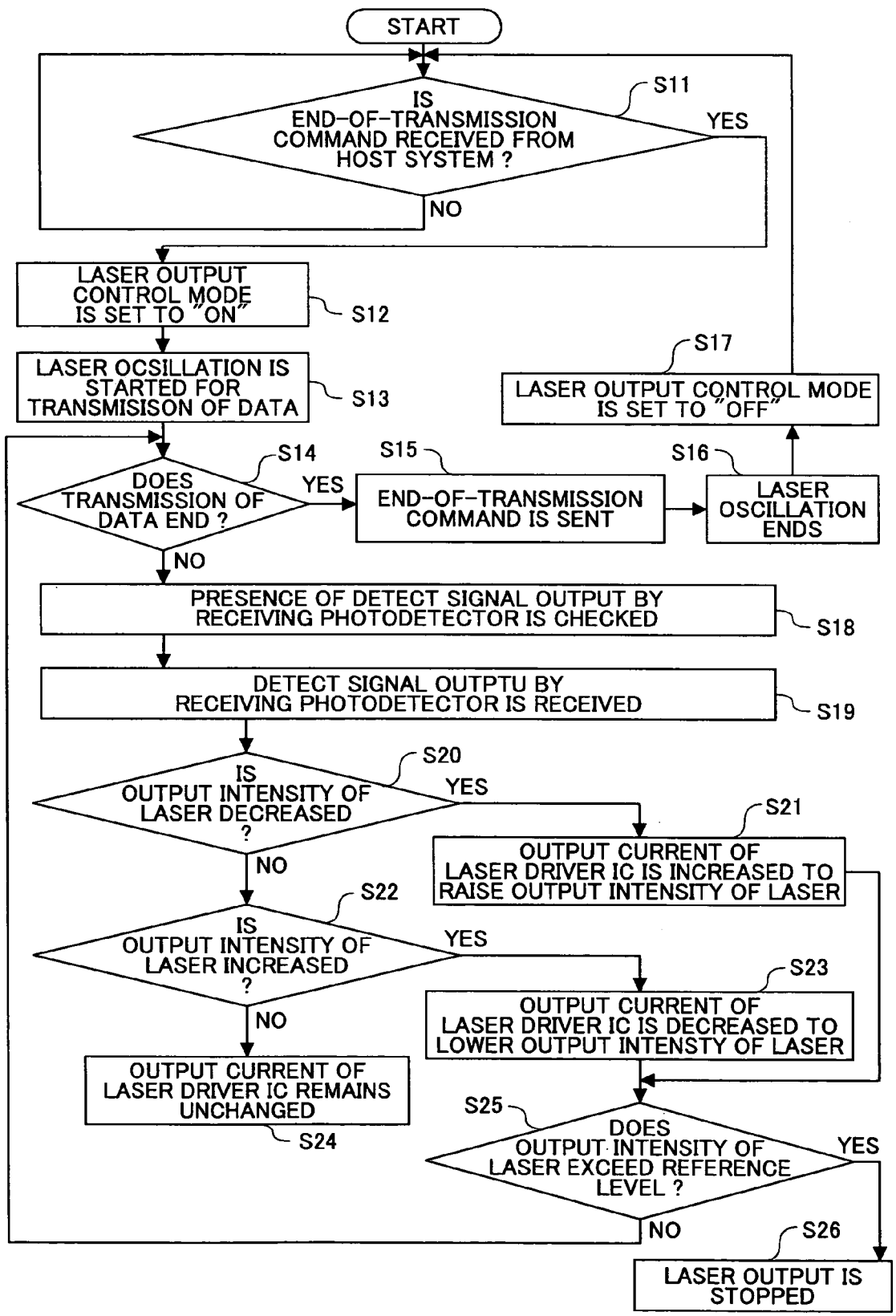
FIG. 3 is a flowchart for explaining the laser array control process which is performed by the laser array device of the present invention.

FIG. 3 is a flowchart for explaining the laser array control processing which is performed by the laser array driver IC of the laser array device of FIG. 2B.

Execution of the laser array control processing shown in FIG. 3 is started upon power up of the laser array device, or at the time of detection of a reset action, or when needed.

In the following, the laser array driver IC 10-1 of the laser array device will be simply called the control unit, for the sake of convenience of explanation.

Moreover, it is assumed that the laser array device of FIG. 2B is built in the information processing device of a first node and it is provided so that transmission and reception of the optical signal to and from the information processing device of a second node through the optical fiber cable is possible. In this case, it is assumed that, when one information processing device transmits the optical signal to another information processing device, the half-duplex data communication is performed in which the former only transmits the optical signal and the latter only receives the optical signal at a time.

The laser array control processing of FIG. 3 is performed as follows.

At a start of the laser array control processing of FIG. 3, the control unit determines whether it receives the end-of-transmission command from the second node's information processing device (S11).

When it is determined at step S11 that the end-of-transmission command is received, the control unit sets the laser output-control mode of the laser array device ON (S12).

When it is determined at step S11 that the end-of-transmission command is not received yet, the control is returned to step S11.

After the step S12 is performed, the control unit starts the oscillation of each of the transmitting laser array 30 according to the information which is to be transmitted to the second node's information processing device (S13).

Next, the control unit determines whether the transmission of all the information which is to be transmitted to the second node's information processing device is completed (S14).

When it is determined at step S14 that the transmission is completed, the control unit transmits the end-of-transmission command to the second node's information processing device (S15). And the control unit stops operation of each laser (S16).

After the step S16 is performed, the control unit sets the laser output-control mode of the laser array device OFF (S17). After the step S17 is performed, the control is returned to step S11.

On the other hand, when it is determined at step S14 that the transmission is still in progress, the control unit checks the existence of the electrical signal outputted from the receiving photodetector 20-1 in the same unit module 40 (S18). In this case, a part of the laser beam outputted from the transmitting laser 30-1 is reflected by the mirrors 52 and 54, and such reflected laser beam is inputted to the receiving photodetector 20-1. If inputted, the receiving photodetector 20-1 converts the inputted laser beam into the electrical signal, and feeds back the electrical signal to the control unit (the laser array driver IC 10-1).

Next, the control unit receives the electrical signal outputted from the receiving photodetector 20-1 in the same unit module 40, and detects the current value of the received electrical signal (S19).

After the step S19 is performed, the control unit determines whether the intensity of the output laser beam of the transmitting laser 30-1 declines based on the current value of the electrical signal received from the receiving photodetector 20-1 (S20).

When it is determined at step S20 that the intensity of the output laser beam declines, the control unit performs control which increases the drive current supplied to the transmitting laser 30-1 to increase the intensity of the laser beam outputted by the transmitting laser 30-1 (S21). After the step S21 is performed, the control unit progresses to the following step S25.

Moreover, when it is determined at step S20 that the intensity of the output laser beam does not declines, the control unit determines whether the intensity of the output laser beam of the transmitting laser 30-1 increases based on the current value of the electrical signal received from the receiving photodetector 20-1 (S22).

When it is determined at step S22 that the intensity of the output laser beam increases, the control unit performs control which decreases the drive current supplied to the transmitting laser 30-1 to lower the intensity of the laser beam outputted by the transmitting laser 30-1 (S23). After the step S23 is performed, the control unit progresses to the following step S25.

On the other hand, when it is determined at step S22 that the intensity of the output laser beam does not increase, the control unit does not change the drive current supplied to the transmitting laser 30-1 (S24).

Moreover, after the step S21 or the step S23 is performed, the control unit determines whether the intensity of the output laser beam of the transmitting laser 30-1 exceeds the reference level based on the current value of the electrical signal received from the receiving photodetector 20-1 (S25).

When it is determined at step S25 that it exceeds the reference level, the control unit stops the supply of the drive current to the transmitting laser, and suspends the laser outputting (S26).

On the contrary, when it is determined at step S25 that it does not exceed the reference level, the control is returned to the step S14.

According to the laser array control method of the present invention, a part of the optical output from each of the respective laser light sources of the communication laser array 30 is detected independently and the feedback control of the detected information is carried out. Even if a failure occurs in any of the individual laser light sources, the optical outputting of the whole laser array device does not stop.

Therefore, the problem that a failure of the monitoring laser or the monitoring photodetector leads to the system-wide failure as in the conventional laser array device is eliminated according to the laser array control method of the present invention.

Figure 4A:
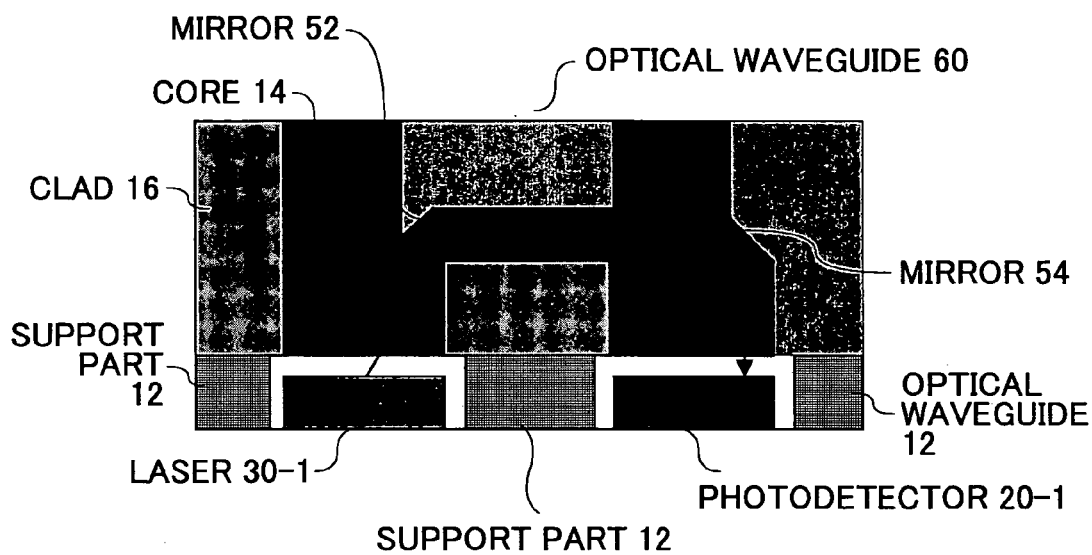
FIG. 4A and FIG. 4B are diagrams showing the composition of the laser array device in the first preferred embodiment of the present invention.
Figure 4B:
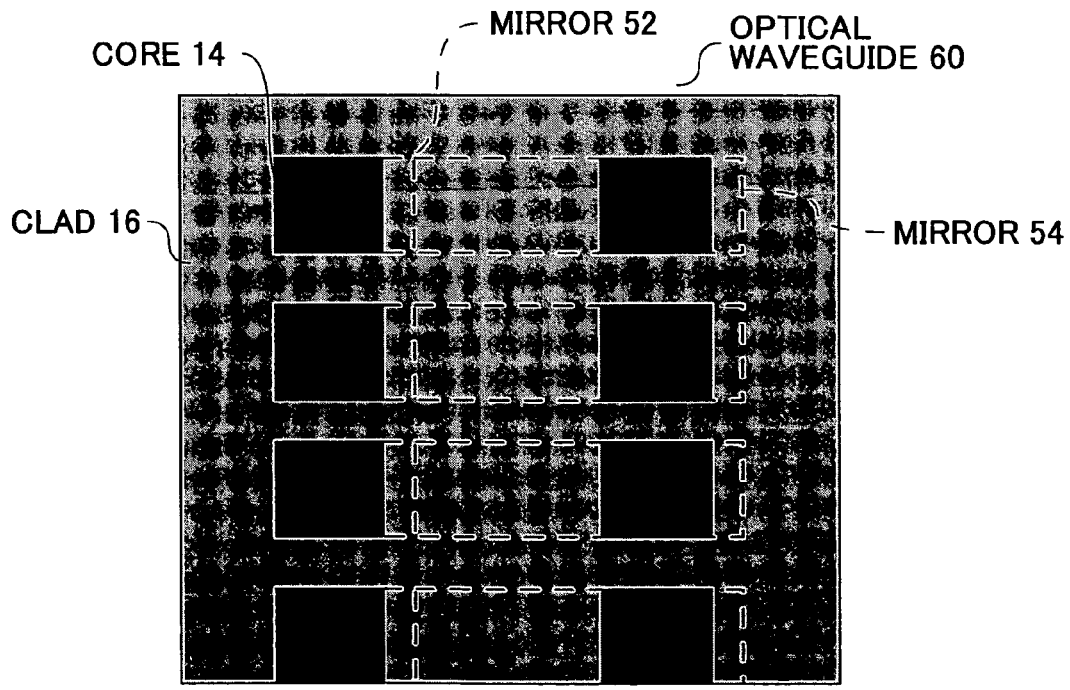

FIG. 4A and FIG. 4B show the composition of the laser array device in the first preferred embodiment of the present invention.

FIG. 4A depicts how the unit modules 40 in the laser array device of this embodiment are arranged in the optical waveguide 60 formed by the core 14 and the clad 16.

Each of the unit modules 40 comprises the transmitting laser 30-1, the receiving photodetector 20-1, the first mirror 52, and the second mirror 54.

The laser 30-1 and the photodetector 20-1 are separated by a predetermined interval and they are attached to the laser array attachment section and the photodetector attachment section of the support part 12, respectively.

The optical waveguide 60 is provided on the support part 12, and the core 14 is formed with the transparent layer which passes the light outputted from the laser 30-1 into the optical fiber cable, and the transparent layer which passes the light inputted from the optical fiber cable into the photodetector 20-1.

The first mirror 52 is formed in the slope section of the clad 16, reflects a part of laser beam outputted from the laser 30-1, and leads it to the second mirror 54.

The second mirror 54 is formed in the slope section provided in the position which counters the first mirror 52 of the clad 16, reflects the reflected light from the first mirror 52 further, and inputs it into the photodetector 20-1.

The photodetector 20-1 detects the received laser beam, and feeds back the detected information to the laser array driver IC (not shown).

It is necessary to form with a sufficiently narrow width the core portion which interconnects the core 14 on the side of the laser and the core 14 on the side of the photodetector so that only the horizontal laser beam can pass through the core portion. This is needed to ensure that the light which reaches from the outside to the photodetector 20-1 does not affect the laser 30-1.

As shown in FIG. 4B, the plurality of the unit modules 40 of the laser array device of this embodiment are arranged along the longitudinal direction of the optical waveguide 60 in one row.

Therefore, the laser 30-1 and the photodetector 20-1 of each unit module 40 are similarly attached to the support part 12, and the transparent layer of the core 14 is formed in the optical waveguide 60 with respect to each of the pairs of the laser 30-1 and the photodetector 20-1 corresponding to the unit modules 40.

The first mirror 52 and the second mirror 54 of each unit module 40 are formed in the respective slope sections of the clad 16 of the optical waveguide 60 in the same arrangement.

Figure 5A:
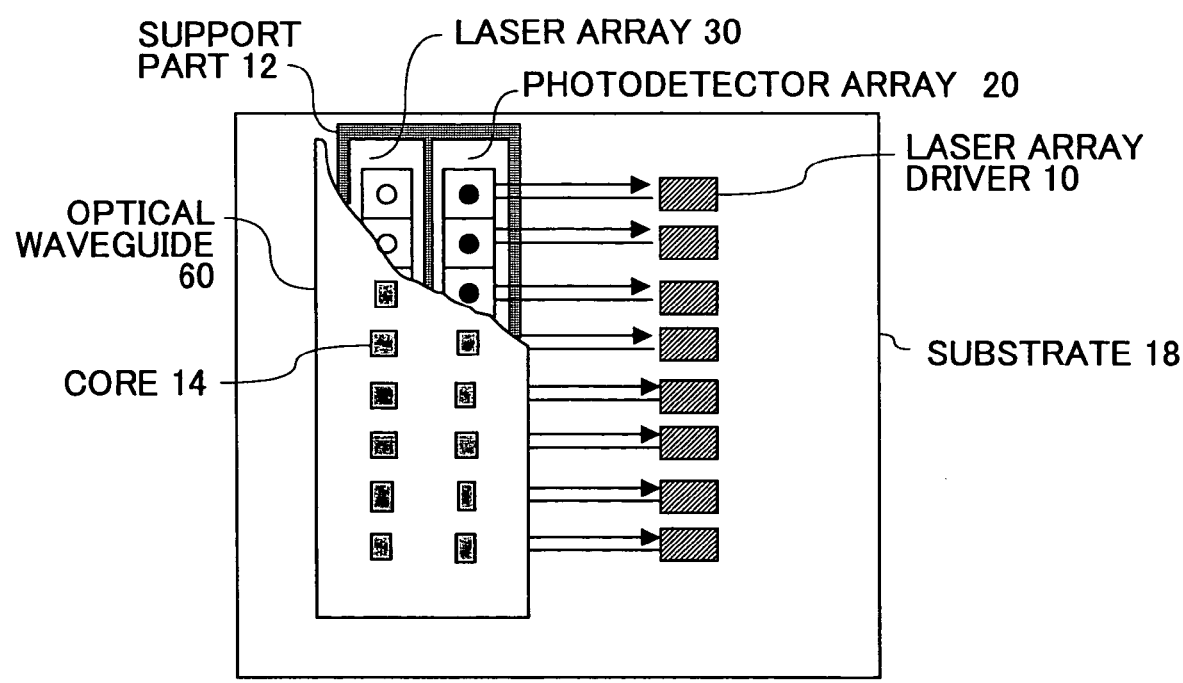
FIG. 5A is a diagram showing the substrate in which the laser array device of FIG. 4B is incorporated.

FIG. 5A shows the composition of the substrate 18 in which the laser array device of FIG. 4B is mounted.

The transmitting laser array 30 and the receiving photodetector array 20 which are attached to the support part 12 are mounted in the substrate 18. The optical waveguide 60 shown in FIG. 4B is attached to the support part 12.

Moreover, one laser array driver IC 10 is mounted on the substrate 18 with respect to each of the plurality of unit modules 40, and the wiring which connects each laser of the transmitting laser array 30 and the corresponding laser array drivers IC 10, and the wiring which connects each photodetector of the receiving photodetector array 20 and the corresponding laser array drivers IC 10 are formed on the substrate 18.

Figure 5B:
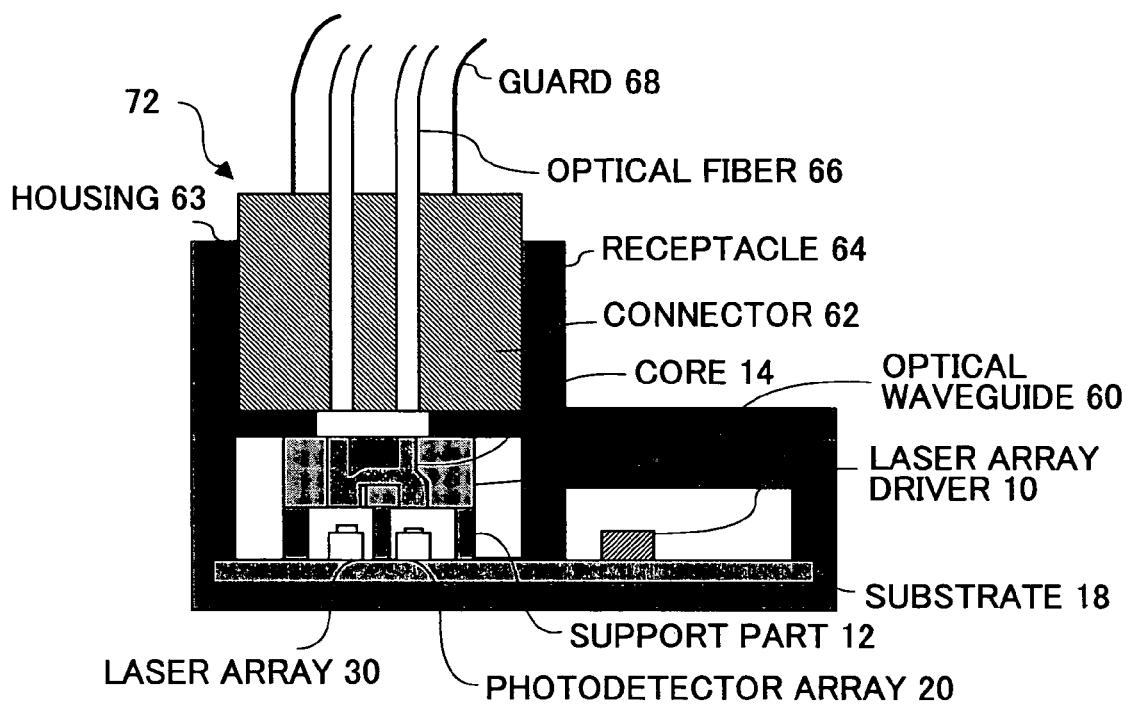
FIG. 5B is a diagram showing the composition of the parallel optical transceiver which utilizes the substrate shown in FIG. 5A.
Figure 5C:
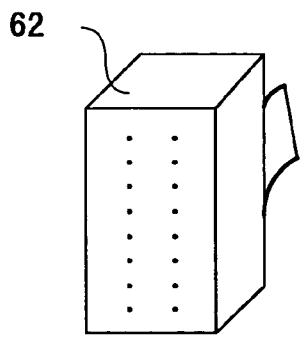
FIG. 5C is a diagram showing the bottom of the optical connector shown in FIG. 5B.

FIG. 5B shows the composition of the parallel light transceiver using the substrate 18 shown in FIG. 5A. FIG. 5C shows the optical connector shown in FIG. 5B.

As shown in FIG. 5B, the parallel light transceiver 72 is built by accommodating the substrate 18 of FIG. 5A in the housing 63.

The connector 62 which is connected to the optical fiber cable 66 is connected with the receptacle 64 which is formed in the upper part of the housing 63.

The optical fiber cable 66 is accommodated in the guard 68, and the optical fiber cable 66 is protected so that it may not be influenced by the external light from the outside.

As shown in FIG. 5C, in the bottom of the connector 62, the plurality of ends of the optical fiber cable 66 are arranged in two rows.

By connecting the connector 62 to the receptacle 64, the ends of the optical fiber cable 66 arranged in one row are coupled to the core 14 on the side of the lasers of the optical waveguide 60, and the ends of the optical fiber cable 66 arranged in the other row are coupled to the core 14 on the side of the photodetectors of the optical waveguide 60.

Figure 6A:
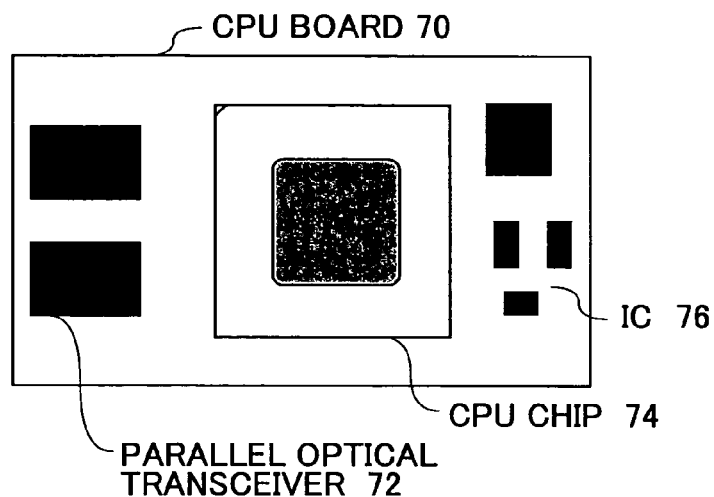
FIG. 6A and FIG. 6B are diagrams showing an example of the multi-CPU information processing device in which the laser array device of the present invention is embodied.
Figure 6B:
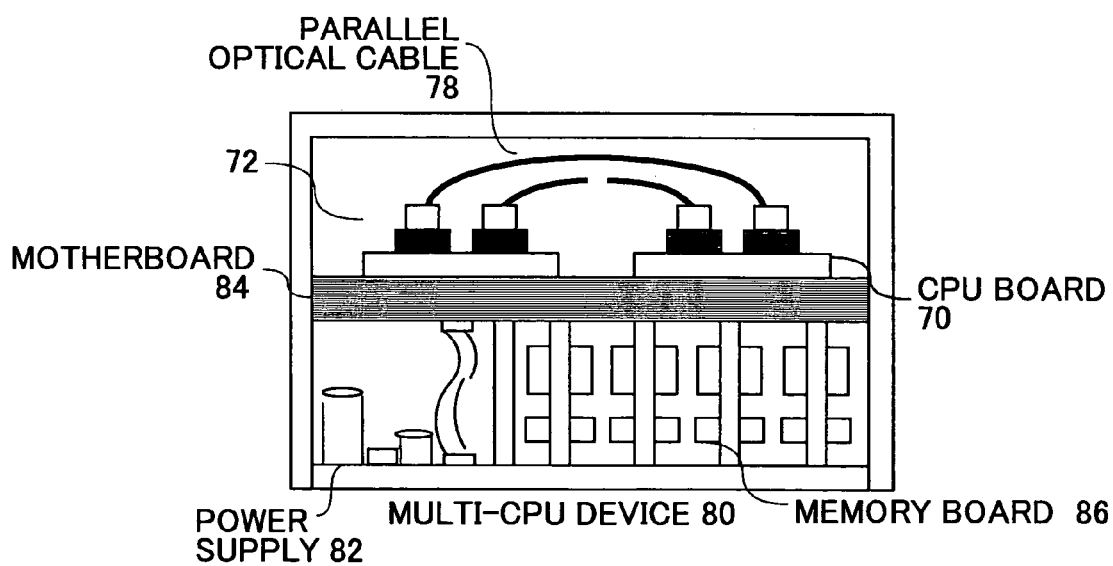

FIG. 6A and FIG. 6B show an example of the multi-CPU information processing device in which the laser array device of the present invention is embodied.

FIG. 6A shows the CPU board 70 in which the optical parallel transceiver 72 in FIG. 5B is mounted.

A pair of the optical parallel transceivers 72, the CPU chip 74, and the other IC chips 76 are mounted in the CPU board 70.

FIG. 6B shows the composition of the multi-CPU information processing device 80 in which a plurality of the CPU boards 70 shown in FIG. 6A are mounted.

In the multi-CPU information processing device 80, the CPU boards 70 which are connected together by the parallel optical cable 78 are mounted on the mother board 84.

In the housing of the multi-CPU information processing device 80, the power supply 82 and the plurality of memory boards 86 are accommodated.

By applying the laser array device of the present invention to this multi-CPU information processing device 80, the safety in the case of transmitting and receiving the laser beam between the respective information processing devices can be improved further.

Figure 7:
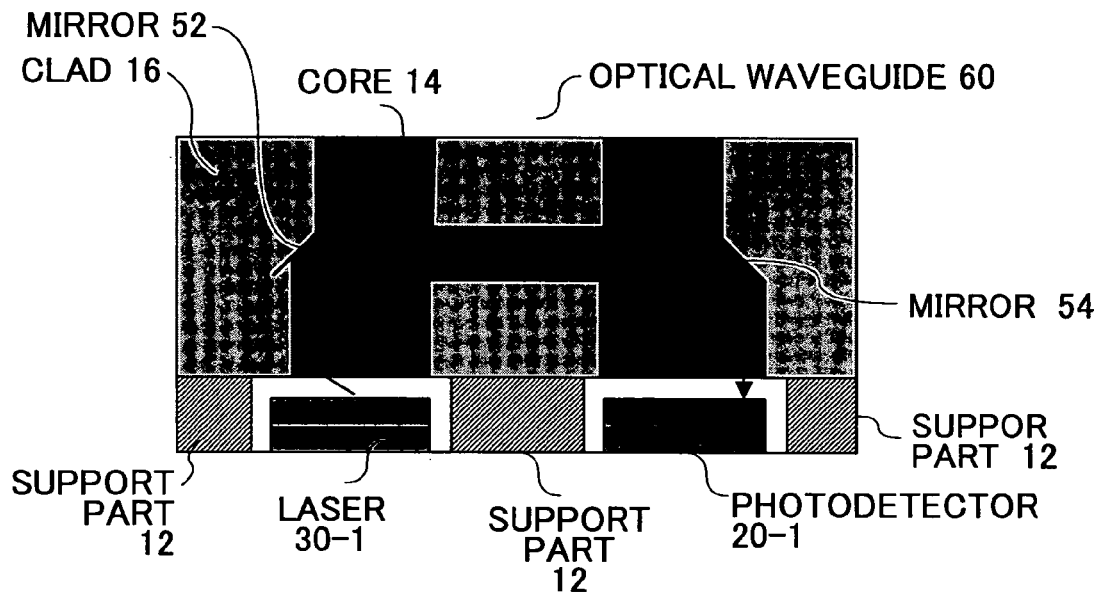
FIG. 7 is a diagram showing the composition of the laser array device in the second preferred embodiment of the present invention.

Next, FIG. 7 shows the composition of the laser array device in the second preferred embodiment of the present invention.

In FIG. 7, the elements which are essentially the same as the corresponding elements shown in FIG. 4A are designated by the same reference numerals, and a description thereof will be omitted.

Similar to the first preferred embodiment mentioned above, the laser array device of the embodiment shown in FIG. 7 is provided so that the plurality of unit modules 40 are arranged along the longitudinal direction of the optical waveguide 60 in one row.

The present embodiment differs from the embodiment of FIG. 4A in that the core 14, the clad 16 and the first mirror 52 are arranged in the optical waveguide 60 included in one unit module 40 as shown in FIG. 7, and the other composition is the same as the embodiment of FIG. 4A.

In the laser array device of this embodiment, a part of the laser beam outputted from the laser 30-1 in each unit module 40 is refracted in the border plane of the laser side core 14 and the clad 16, and the laser beam which passes through this border plane is reflected by the first mirror 52. This reflected light is horizontally led to the second mirror 54.

The second mirror 54 reflects the reflected light further, and inputs it into the photodetector 20-1. For this reason, the first mirror 52 is formed in the slope section provided in the border plane of the laser side clad 16 and the core 14.

Similar to the embodiment of FIG. 4A, the core portion which interconnects the core 14 on the side of the lasers and the core 14 on the side of the photodetectors is formed with a sufficiently narrow width so that only the horizontal laser beam can pass through the core portion.

Figure 8:
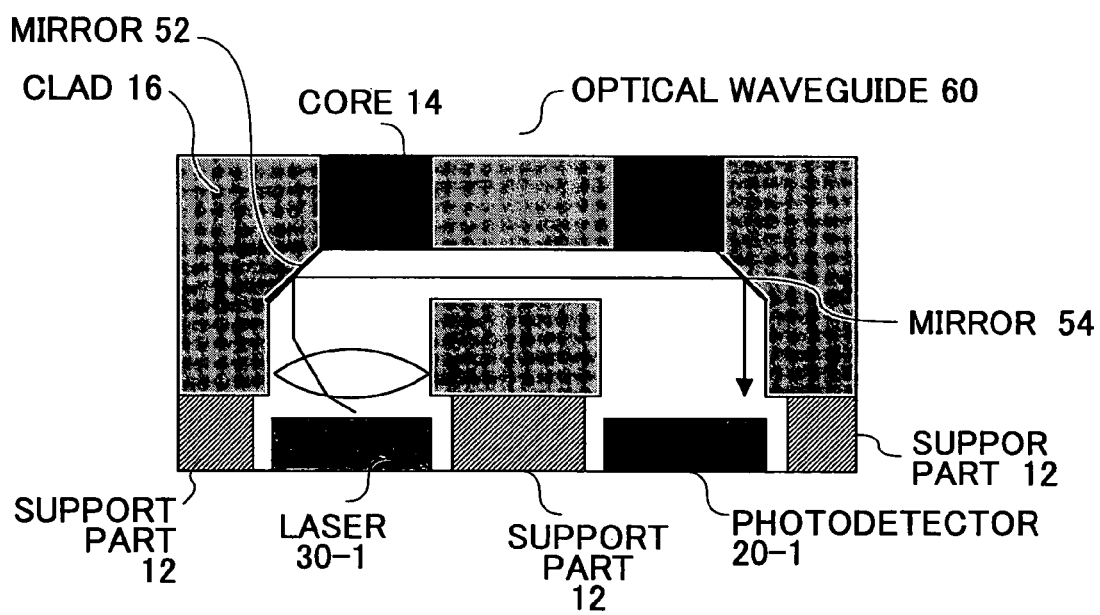
FIG. 8 is a diagram showing the composition of the laser array device in the third preferred embodiment of the present invention.

Next, FIG. 8 shows the composition of the laser array device in the third preferred embodiment of the present invention.

In FIG. 8, the elements which are essentially the same as the corresponding elements shown in FIG. 4A are designated by the same reference numerals, and a description thereof will be omitted.

Similar to the first preferred embodiment mentioned above, the laser array device of the embodiment shown in FIG. 8 is provided so that the plurality of unit modules 40 are arranged along the longitudinal direction of the optical waveguide 60 in one row.

The present embodiment differs from the embodiment of FIG. 4A in that, in this embodiment, the core 14 the clad 16, and the first mirror 52 are arranged in the optical waveguide 60 included in one unit module 40, and the lens 56 is added over the transmitting laser 30-1 as shown in FIG. 8. The other composition is the same as that of the previous embodiment.

In the laser array device of this embodiment, the laser beam outputted from the laser 30-1 in each unit module 40 is refracted with the lens 56, and a part of the refraction light is reflected by the first mirror 52. This reflected light is horizontally led to the second mirror 54.

The second mirror 54 reflects the reflected light further, and inputs it into the photodetector 20-1. The optical waveguide 60 of this embodiment forms the core 14 only in the upper part, and does not form the core 14 in the range where the refraction light from the lens 56 passes.

For this reason, the first mirror 52 and the second mirror 54 are formed in the slope section of the laser side clad 16 and the slope section of the photodetector side clad 16, respectively.

Similar to the embodiment of FIG. 4A, the void portion which interconnects the laser side and the photodetector side is formed with a sufficiently narrow width so that only the horizontal laser beam can pass through the void portion.

Next, FIG. 9A through FIG. 13B are diagrams for explaining the production method of the optical waveguide 60 of the laser array device shown in FIG. 4B.

In order to produce the optical waveguide 60 shown in FIG. 4B, the board material of a dielectric material which have a suitable thickness is first cut into pieces with the size of the optical waveguide 60, and the clad 16-1 of the first layer is prepared.

The holes are formed in the position where the transparent layer which passes the laser beam outputted from the laser to the exterior of the clad 16-1 is formed, and the position where the transparent layer which passes the light inputted from the exterior into the photodetector is formed, respectively.

Figure 9A:
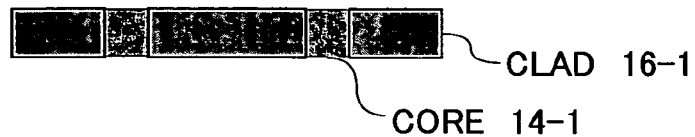
FIG. 9A and FIG. 9B are diagrams for explaining a method of producing the optical waveguide of the laser array device shown in FIG. 4B.
Figure 9B:
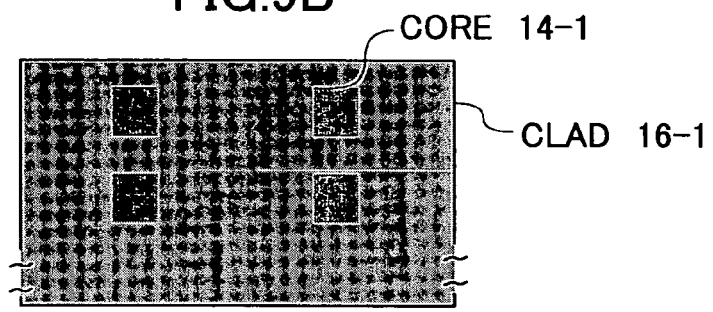

As shown in FIG. 9A and FIG. 9B, the core 14-1 is embedded in the two holes of the clad 16-1 of the first layer.

In FIG. 9A and FIG. 9B, the left-hand side core 14-1 is equivalent to the transparent layer which passes the light inputted from the exterior into the photodetector, and the right-hand side core 14-1 is equivalent to the transparent layer which passes the laser beam outputted from the laser to the exterior.

Next, the clad 16-2 of the second layer is accumulated on the clad 16-1 of the first layer.

This clad 16-2 of the second layer is formed in order to form the core portion which interconnects the core on the side of the lasers and the core on the side of the photodetectors, and it is formed from the board material of the same dielectric material with a sufficiently small thickness.

The hole for forming the above core portion is formed in the clad 16-2 of the second layer, and the slope sections are formed in the clad 16-2 of the second layer on both the sides of the hole.

The left-hand side slope section (photodetector side) is formed so that it is slanted by the angle of 45 degrees to the horizontal direction, and the right-hand side slope section is formed so that the reflected light reflected by the mirror is directed horizontally by taking into consideration the spread angle of the laser beam outputted from the laser.

Figure 10A:
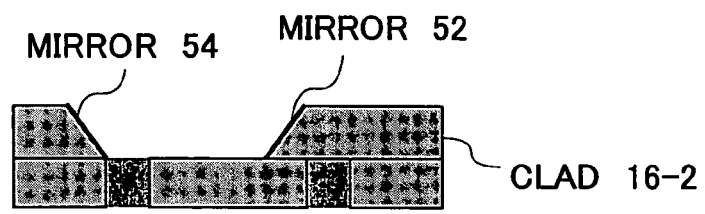
FIG. 10A and FIG. 10B are diagrams for explaining the method of producing the optical waveguide of the laser array device shown in FIG. 4B.
Figure 10B:
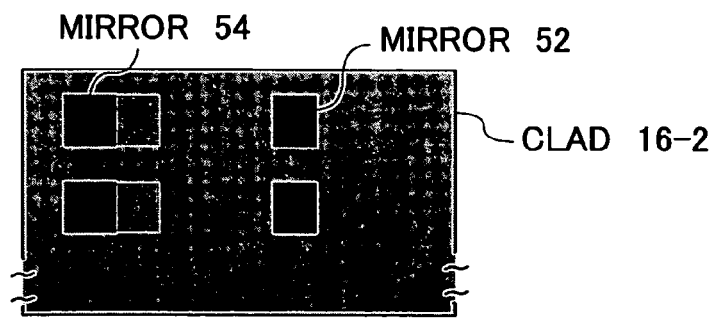

Next, as shown in FIG. 10A and FIG. 10B, the mirror 54 and the mirror 52 are formed in the slope sections which are formed on the left and right sides of the hole section of the clad 16-2 of the second layer, respectively.

In this embodiment, gold (Au) is used as a material of the mirrors, and the mirror 54 and the mirror 52 are formed by carrying out vacuum evaporation of gold to the slope sections.

Figure 11A:
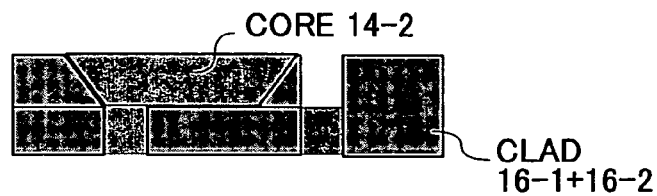
FIG. 11A and FIG. 11B are diagrams for explaining the method of producing the optical waveguide of the laser array device shown in FIG. 4B.
Figure 11B:
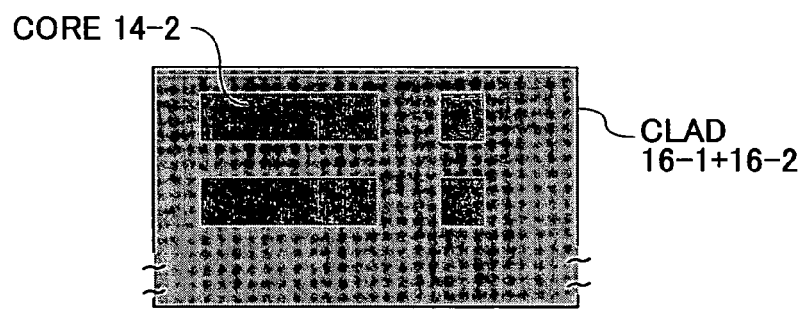

Next, as shown in FIG. 11A and FIG. 11B, the core 14-2 is embedded in the hole section of the clad 16-2 of the second layer, and the additional hole is newly formed in the part of the clad 16-2 of the second layer which is equivalent to the transparent layer which passes the laser beam outputted from the laser to the exterior.

The core 14-2 serves as the transparent layer which is extended horizontally to interconnect the core on the side of the lasers and the core on the side of the photodetectors.

This transparent layer 14-2 is formed with a sufficiently narrow width as mentioned above, and only the reflected light from the core on the side of the lasers to the core on the side of the photodetectors passes through, and thereby preventing the light inputted into the photodetectors from the exterior from affecting the lasers.

Figure 12A:
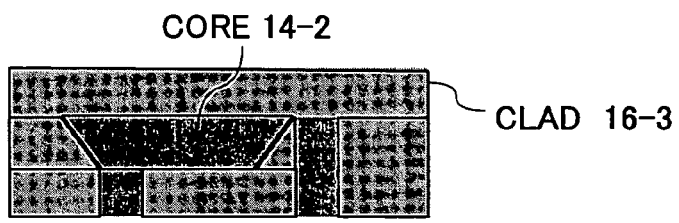
FIG. 12A and FIG. 12B are diagrams for explaining the method of producing the optical waveguide of the laser array device shown in FIG. 4B.
Figure 12B:
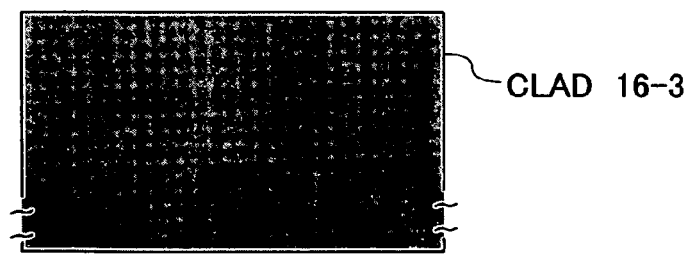

Next, as shown in FIG. 12A and FIG. 12B, after the core is embedded in the second hole of the clad 16-2 of the second layer, the clad 16-3 of the third layer is accumulated on the clad 16-2 of the second layer.

Figure 13A:
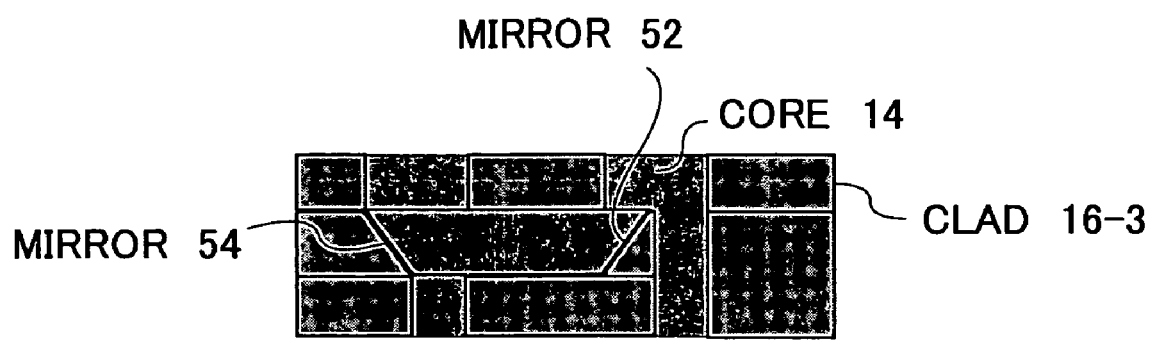
FIG. 13A and FIG. 13B are diagrams for explaining the method of producing the optical waveguide of the laser array device shown in FIG. 4B.
Figure 13B:
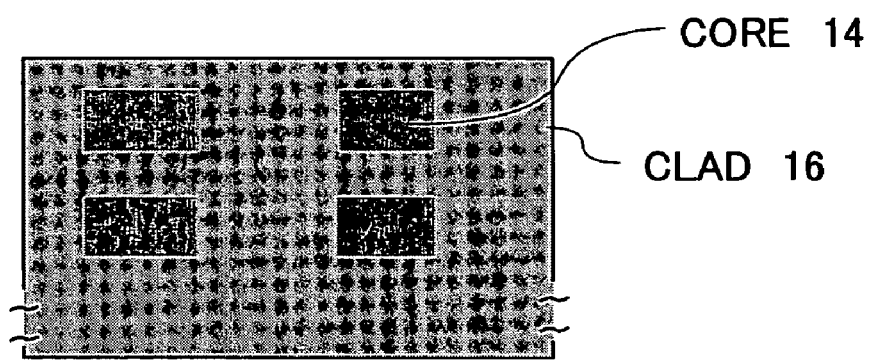

Furthermore, as shown in FIG. 13A and FIG. 13B, the holes are formed in the position of the third clad 16-3 where the transparent layer which passes the laser beam outputted from the laser to the exterior is formed, and in the position of the third clad 16-3 where the transparent layer which passes the light inputted from the exterior into the photodetector is formed, respectively. Thus, the optical waveguide 60 is produced by embedding the core in the respective holes.

The present invention is not limited to the above-described embodiments, and variations and modifications may be made without departing from the scope of the present invention.

What is claimed is:

1. A laser array device comprising:
    a transmitting unit having a plurality of lasers outputting laser beams carrying transmission data which are sent to an external device;
    a receiving unit having a plurality of optical detectors which directly detect laser beams carrying data which are received from an external device located directly above said optical detectors; and
    a control unit having a plurality of laser control circuits which respectively drive the lasers of the transmitting unit in accordance with the transmission data,
    wherein the plurality of lasers and the plurality of optical detectors are formed adjacent to each other into a plurality of unit modules, each of the plurality of unit modules consisting of one of the lasers of the transmitting unit, one of the optical detectors of the receiving unit, which adjoin to each other, and one of the laser control circuits of the control unit, and
    wherein each unit module includes intermediate core opening formed in an overlaying clad to interconnect a transparent core opening formed above one of the lasers within the unit module and a transparent core opening formed above one of the optical detectors within the unit module, allowing a horizontally reflected laser beam from said one of the lasers to pass through said intermediate core opening to said one of the optical detectors.

2. The laser array device according to claim 1 wherein each of the plurality of unit modules comprises a mirror which reflects a part of a laser beam outputted from the laser concerned and inputs the part of the laser beam into the optical detector concerned.

3. The laser array device according to claim 1 wherein each of the plurality of unit modules is formed on an optical waveguide which is provided with a mirror which reflects a part of laser beam outputted from the laser concerned and inputs the part of the laser beam into the optical detector concerned.

4. The laser array device according to claim 1, wherein each of said lasers of the transmitting unit has a transparent core opening formed in an overlaying clad which is distinct and separate from another transparent core opening formed in said clad over each of said optical detectors of the receiving unit within said unit modules.

5. An information processing device in which a laser array device is incorporated, the information processing device transmitting an optical signal to and receiving an optical signal from an external information processing device through an optical fiber cable, the laser array device comprising:

a transmitting unit having a plurality of lasers outputting laser beams carrying transmission data which are sent to an external device;

a receiving unit having a plurality of optical detectors which directly detect laser beams carrying data which are received from an external device located directly above said optical detectors; and a control unit having a plurality of laser control circuits which respectively drive the lasers of the transmitting unit in accordance with the transmission data, wherein the plurality of lasers and the plurality of optical detectors are formed adjacent to each other into a plurality of unit modules, each of the plurality of unit modules consisting of one of the lasers of the transmitting unit, one of the optical detectors of the receiving unit, which adjoin to each other, and one of the laser control circuits of the control unit, and wherein each unit module includes intermediate core opening formed in an overlaying clad to interconnect a transparent core opening formed above one of the lasers within the unit module and a transparent core opening formed above one of the optical detectors within the unit module, allowing a horizontally reflected laser beam from said one of the lasers to pass through said intermediate core opening to said one of the optical detectors.

6. The information processing device according to claim 5, wherein each of said lasers of the transmitting unit has a transparent core opening formed in an overlaying clad which is distinct and separate from another transparent core opening formed in said clad over each of said optical detectors of the receiving unit within said unit modules.

7. A method of controlling a laser array device which comprises a transmitting unit having a plurality of lasers outputting laser beams carrying transmission data which are sent to an external device, a receiving unit having a plurality of optical detectors which directly detect laser beams carrying data which are received from an external device located directly above said optical detectors, and a control unit having a plurality of laser control circuits which respectively drive the lasers of the transmitting unit in accordance with the transmission data, wherein the plurality of lasers and the plurality of optical detectors are formed adjacent to each other into a plurality of unit modules, each of the plurality of unit modules consisting of one of the lasers of the transmitting unit, one of the optical detectors of the receiving unit, which adjoin to each other, and one of the laser control circuits of the control unit, the method comprising the steps of:

reflecting a part of laser beam outputted from the laser concerned of each unit module when the laser output of the laser concerned is in progress, so that the part of the laser beam is inputted into the optical detector concerned;

detecting an intensity of the laser beam outputted from the laser concerned based on a detection signal outputted from the optical detector concerned;

stopping the laser output of the laser concerned when the detected laser-beam intensity exceeds a predetermined reference level; and wherein each unit module includes intermediate core opening formed in an overlaying clad to interconnect a transparent core opening formed above one of the lasers within the unit module and a transparent core opening formed above one of the optical detectors within the unit module, allowing a horizontally reflected laser beam from said one of the lasers to pass through said intermediate core opening to said one of the optical detectors.

* * * * *